United States Patent [19]
Tsujino et al.

[11] Patent Number: 5,112,722
[45] Date of Patent: May 12, 1992

[54] METHOD OF PRODUCING LIGHT CONTROL PLATE WHICH INDUCES SCATTERING OF LIGHT AT DIFFERENT ANGLES

[75] Inventors: Toshifumi Tsujino; Koichi Maeda; Satoshi Ishizuka; Hiroaki Yamamoto, all of Osaka; Shinichiro Kitayama; Shigeo Hozumi, both of Tsukuba, all of Japan

[73] Assignees: Nippon Sheet Glass Co., Ltd.; Sumitomo Chemical Company, Limited, both of Osaka, Japan

[21] Appl. No.: 507,114

[22] Filed: Apr. 10, 1990

[30] Foreign Application Priority Data

Apr. 12, 1989 [JP] Japan ................................. 1-92151

[51] Int. Cl.⁵ .............................................. G03C 5/00
[52] U.S. Cl. ..................................... 430/290; 430/328; 430/330; 430/397
[58] Field of Search ............... 430/270, 290, 328, 396, 430/397, 330

[56] References Cited

U.S. PATENT DOCUMENTS 4,600,667 7/1986 Uchida ................................. 430/328
4,777,116 11/1988 Kawatsuki et al. ................. 430/290
4,971,895 11/1990 Sullivan ............................... 430/328

FOREIGN PATENT DOCUMENTS 179925 5/1986 European Pat. Off. .
2458087 12/1980 France .
1040946 1/1989 Japan .

OTHER PUBLICATIONS

Applied Optics, vol. 15, No. 2, Feb. 1, 1976, pp. 534–541; W. J. Thomlinson et al.: "Multicomponent photopolymer systems for volume phase holograms and grating devices", p. *534, right column, paragraph 2*, *p. 535, right column, paragraph 2*, *p. 537, right column, paragraph 3–p. 538, right column, paragraph 1; table 1*.

Japanese Journal of Applied Physics, vol. 25, No. 10, Oct. 1, 1986, K. Kodate et al.: "A blazed grating fabricated by synchrotron radiation lithography", *p. 822, left column, paragraph 2–p. 823, left column, line 2; figures*.

Primary Examiner—Marion E. McCamish
Assistant Examiner—Kathleen Duda
Attorney, Agent, or Firm—Wenderoth, Lind & Ponack

[57] ABSTRACT

A method of producing a light control plate which induces scattering of light at different angles of incidence for different places. The method comprises (1) preparing an assembly comprising a film of a photopolymerizable composition and a light-pervious body having a light-impervious pattern arranged along the surface of the film, (2) irradiating light limitedly to the assembly from that side where the light-pervious body at a limited angle while moving the assembly continuously in the planar direction of the film thereby to polymerize at least part of the photopolymerizable film, the light being emitted from a first linear light source whose long axis is positioned in a direction crossing the moving direction of the assembly; and thereafter (3) polymerizing the photopolymerizable composition of that portion of the film-like molded article which is covered with the light-impervious pattern of the light-pervious body by light irradiation or heating.

6 Claims, 5 Drawing Sheets

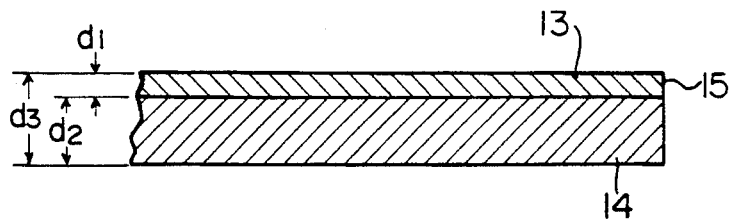
Fig. 9
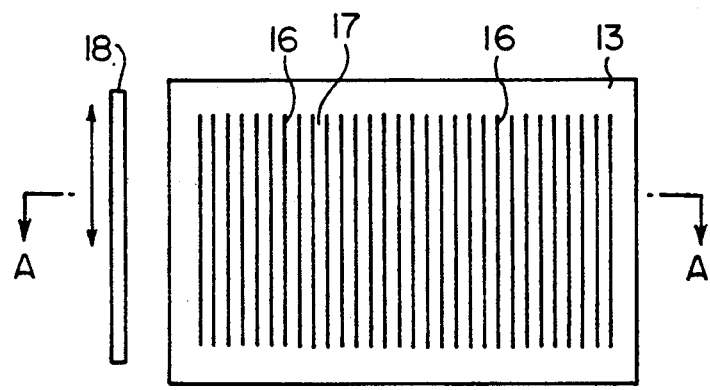
Fig. 10
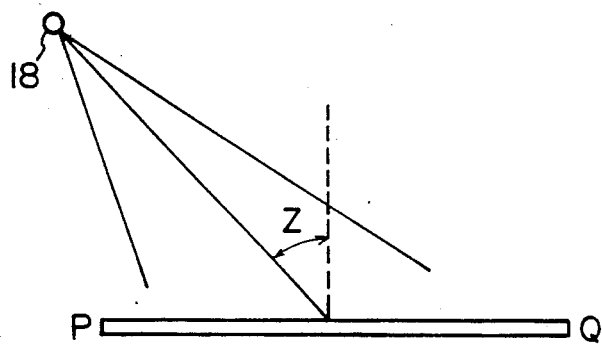
Fig. 11-b
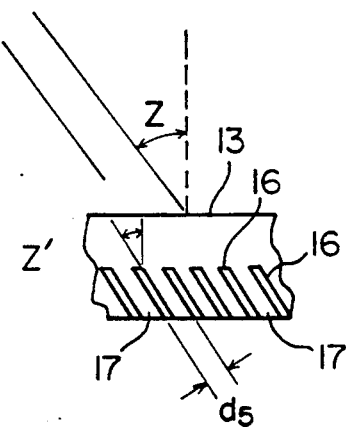
Fig. 11-a
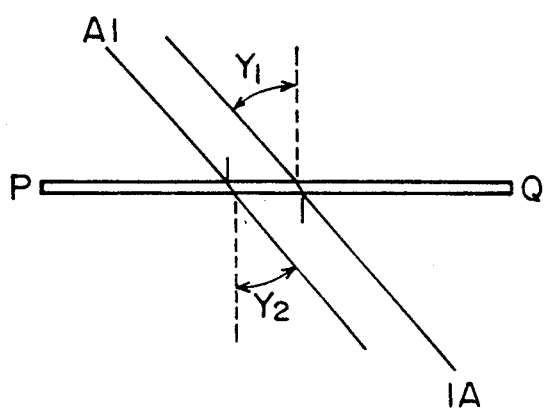
Fig. 12

METHOD OF PRODUCING LIGHT CONTROL PLATE WHICH INDUCES SCATTERING OF LIGHT AT DIFFERENT ANGLES

This invention relates to a light control sheet which scatters light having different angles of incidence at different places, for example which scatters light having a specific angle of incidence.

Conventional transparent bodies made of plastics or glass are transparent to light rays from any angles. As a structure which is pervious to light falling only from a specific angle, a "light-shielding plate" has generally been used which is composed of a relief forming lattices or fringes on a transparent substrate using an oriented film cut out from a plastic block obtained by alternately bonding a transparent plastic sheet and a non-transparent plastic sheet or from a photosensitive resin, and a transparent plate further combined on the relief. Such a light-shielding plate is proposed, for example, in Japanese Laid-Open Patent Publication No. 189439/1982.

Conventional oriented films or light-shielding plates are very costly because the manufacturing methods for them are very complex, the oriented films alone do not give homogeneous film quality.

Japanese Laid-Open Patent Publication No. 40902/1989 discloses a method of producing a light control plate having the function of scattering light rays which are incident at a predetermined angle which comprises maintaining a resin composition comprising at least two photopolymerizable oligomers or monomers having different refractive indice in a film form, and irradiating light from a specific direction to the film-like resin composition to cure it. The method more specifically comprises disposing a photomask having a first shape between a first linear light irradiating source and the film-like structure and irradiating light from the irradiating source, simultaneously with it, disposing a second linear light irradiating source located opposite to the first light irradiating source with respect to the film-like structure, disposing a photomask having a second shape between the irradiating source and the film-like structure, and irradiating light from the second irradiating source.

Japanese Laid-Open Patent Publication No. 40903/1989 discloses a method of producing a light control plate as in the method disclosed in the above-cited patent document, which comprises dividing the surface of the film-like structure into a plurality of regions, irradiating light from a linear light irradiating source to at least one region, and to another region, (A) irradiating light from the linear light irradiating source at different angles from the above irradiating source, or (B) irradiating light from a point light source, or applying parallel light, or (C) irradiating diffused light, or by (D) applying heat.

Japanese Laid-Open Patent Publication No. 77001/1989 discloses a light control plate composed of a plastic sheet which selectively diffuses incident light having a specific angle of incidence, and a method for its production.

In the above manufacturing method, a rod-like lamp is used as a light source. The resin plate which cures under light irradiation shows anisotropy in the long and short axes of the light source. Only when the resin plate is rotated with respect to the long axis direction of the light source, it scatters light at a predetermined angle only when rotated in the long axis of the light source. Specifically, the resulting resin plate exists while a region having a different refractive index is oriented in a certain direction, and light which falls upon at a specific angle is considered to be diffused by this structure.

In the above light control plate, as described in the above patent document, part of the substrate plate is transparent at the front and is non-transparent when tilted to any side, with the remainder having a reverse function. There may be prepared a light control plate in which a first portion of the substrate plate is non-transparent when viewed from the front, a second portion is always non-transparent and the remainder is always transparent.

According to the method described in the above patent document, a photopolymerizable composition containing at least two compounds having at least one polymerizable carbon-carbon double bond in the molecules and having different refractive indices is maintained in a film form, and light is irradiated from a specific direction to cure it. A portion of the surface of the film-like structure is divided into a plurality of areas by covering it with a photomask. Light from a first linear light irradiating source is irradiated to at least one of the areas, for example, that portion which faces the opening of the photomask, and light from a second linear light irradiating source is irradiated to at least one other area, for example, a portion covered by the photomask, at a different angle from that applied from the first irradiation source to perform curing. If after this, there is still an unirradiated portion, curing is completed by applying light or by polymerizing it with heat. As a result, there can be obtained a light control plate in which various regions having various different angles of diffusion are provided in the film-like structure.

Instead of the second linear light irradiating source, point light, light or parallel light may be irradiated from the point light source, or it is also possible to irradiate diffusing light or to apply heat. If point light, light or parallel light is irradiated from a point light source, the cured region uniformly becomes like frosted glass, and only that region which was cured by light applied from the above first light source becomes a light control film having angle dependence.

If diffusing light is irradiated, only that region which was cured by the first light souce becomes angle-dependent, and a region cured later becomes a transparent light control film. The above conventional method can produce a light control plate having various different scattering angles within a single resin plate.

It is an object of this invention to provide a method of continuous production of a light control plate.

Another object of this invention is to provide a method which can continuously produce a light control plate having a relatively broad region having a predetermined incidence angle of scattering light, which cannot be produced by a conventional batch method.

Still another method of this invention is to provide a method of continuously producing a light control plate having a light-impervious pattern clearly transferred in the long axis direction of a linear light source.

Other objects of this invention along with its advantages will become apparent from the following description.

These objects and advantages of this invention are achieved firstly by a method of producing a light control plate which induces scattering of light at different angles of incidence for different places, which comprises (1) preparing an assembly comprising a film of a photopolymerizable composition and a light-pervious body having a light-impervious pattern arranged along the surface of the film, said polymerizable composition being selected from (a) an intimate mixture of at least two monomers having polymerizable carbon-carbon double bonds and being capable of forming polymers having different refractive indices, (b) at least one monomer having a plurality of polymerizable carbon-carbon double bonds in the molecule, and (c) an intimate mixture of a compound free from a polymerizable carbon-carbon double bond and at least one monomer having a polymerizable carbon-carbon double bond and capable of forming a polymer having a different refractive index from that of said compound, (2) irradiating light limitedly to the assembly from that side where the light-pervious body exists while moving the assembly continuously in the planar direction of the film thereby to polymerize at least part of the photopolymerizable film, the light being emitted from a first linear light source whose long axis is positioned in a direction crossing the moving direction of the assembly; and thereafter (3) polymerizing the photopolymerizable composition of that portion of the film-like molded article which is covered with the light-impervious pattern of the light-pervious body by light irradiation or heating.

BRIEF DESCRIPTION OF THE DRAWINGS

FIGS. 9, 10, 11a, 11b and 12 serve for illustrating the principle of the present invention.

Figure 1:
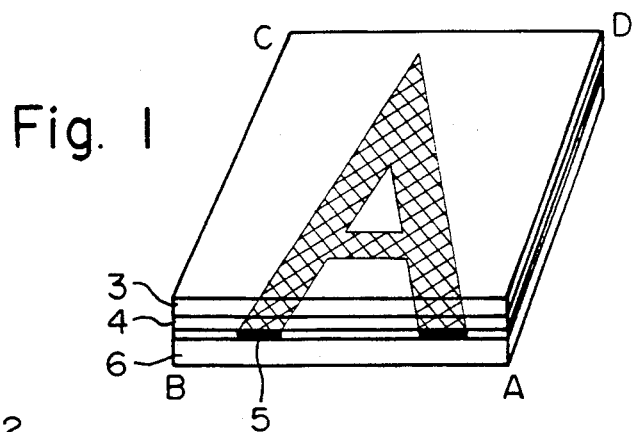
FIG. 1 is a perspective view of one example of an assembly comprising a polymerizable composition and a light-impervious pattern used in step (1) of this invention.

In the first step of the method of this invention, an assembly composed of a film of the photopolymerizable composition and a light-pervious body having a light-impervious pattern arranged along the surface of the film is prepared.

The photopolymerizable composition contains an unsaturated compound having a polymerizable carbon-carbon double bond. The photopolymerizable composition is selected from (a) an intimate mixture of at least two monomers having polymerizable carbon-carbon double bonds and being capable of forming polymers having different refractive indices, (b) at least one monomer having a plurality of polymerizable carbon-carbon doubles bond in the molecule, and (c) an intimate mixture of a compound free from a polymerizable carbon-carbon double bond and at least one monomer having a polymerizable carbon-carbon double bond and capable of forming a polymer having a refractive index different from that of the above compound.

The monomer constituting the intimate mixture (a) has a polymerizable carbon-carbon double bond.

Examples of suitable polymerizable double bonds are acryloyl, methacryloyl, vinyl and allyl groups.

Examples of such monomers include polyfunctional acrylates or the corresponding methacrylates such as polyester acrylates, polyol polyacrylates, modified polyol polyacrylates, polyacrylates having an isocyanuric acid skeleton, melamine acrylate, polyacrylate having a hydantoin skeleton, polybutadiene acrylate, epoxy acrylate, urethane acrylate, bisphenol A diacrylate, 2,2-bis(4-acryloxyethoxy-3,5-dibromophenyl)propane; monofunctional acrylates and the corresponding methacrylates such as methyl acrylate, tetrahydrofurfuryl acrylate, ethyl carbitol acrylate, dicyclopentenyloxyethyl acrylate, isobornyl acrylate, phenyl carbitol acrylate, nonyl phenoxyethyl acrylate, 2-hydroxy-3-phenoxypropyl acrylate, omega-hydroxyhexanoyloxy ethyl acrylate, acryloyloxyethyl succinate, acryloyloxyethyl phthalate, phenyl acrylate, tribromophenyl acrylate, phenoxy ethyl acrylate, tribromophenoxy ethyl acrylate, benzyl acrylate, p-bromobenzyl acrylate, 2-ethyl hexyl acrylate, lauryl acrylate, and 2,2,3,3-tetrafluoropropyl acrylate; vinyl compounds such as styrene, p-chlorostyrene, divinylbenzene, vinyl acetate, acrylonitrile, N-vinylpyrrolidone and vinylnaphthalene; and allyl compounds such as diethylene glycol bisallyl carbonate, diallyidene pentaerythritol, triallyl isocyanurate, diallyl phthalate and diallyl isophthalate. These compounds may be used as monomers or as oligomers.

In the intimate mixture (a), at least two monomers are used. They should be used in such a combination that will give homopolymers having refractive indices. Combinations which give homopolymers whose difference in refractive index is greater are preferred. Advantageously, monomer combinations which give two homopolymers whose difference in refractive index is at least 0.01, preferably 0.05, are used. When three or more kinds of monomers are to be used, they are desirably combined such that the refractive indices of at least two of the resulting homopolymers differ from each other by 0.01, preferably 0.05.

In the intimate mixture (a), two monomers which will give homopolymers having the largest refractive index difference are used in a weight ratio of from 10:90 to 90:10.

Preferably, at least two homopolymers obtained from at least two monomers are not fully compatible with each other. If they have so high compatibility with each other, the resulting resin becomes completely uniform, and does not become hazy. If they have extremely poor compatibility with each other, phase separation occurs before photocuring takes place so that the haze percentage of the resulting resin rises too much. Hence, the resin becomes hazy throughout, and does not easily show a light controlling function.

As required, the intimate mixture (a) may contain a photopolymerization initiator.

There is no particular limitation on the photopolymerization initiator, and any initiators which are used in ordinary photopolymerization may be used. Examples include benzophenone, benzil, Michler's ketone, 2-chlorothioxanthone, benzoin ethyl ether, diethoxyacetophenone, benzyl dimethyl ketal, 2-hydroxy-2-methylpropiophenone, and 1-hydroxycyclohexylphenylketone.

The intimate mixture (a) can be prepared by mixing at least two monomers and as required, a photo-polymerization initiator with stirring.

Among the monomers having a plurality of polymerizable carbon-carbon double bond in the molecule constituting the polymerizable composition (b) a compound having a plurality of polymerizable carbon-carbon double bonds in the molecule such as acryloyl, methacryloyl, vinyl or allyl groups may be advantageously used.

Examples of such a compound include triethylene glycol diacrylate, polyethylene glycol diacrylate, neopentyl glycol diacrylate, 1,6-hexanediol diacrylate, hydrogenated dicyclopentadienyl diacrylate, ethylene oxide modified bisphenol A diacrylate, trimethylol propane triacrylate, pentaerythritol hexacrylate, trisacryloxy isocyanurate, polyfunctional epoxy acrylate, polyfunctional urethane acrylate, methacrylates corresponding to these acrylates, divinylbenzene, triallyl isocyanurate and diethylene glycol bis-allyl carbonate.

These compounds may be used as monomers or oligomers.

Advantageous among these compounds may be those whose refractive indices before curing differs from those after curing by at least 0.01, preferably at least 0.02.

Such compounds may be used singly or as a mixture of two or more together with a photopolymerization initiator, as required. The photopolymerization initiators that can be used may be the same as those described with reference to the intimate mixture (a).

The intimate mixture (c) is composed of a compound free from a polymerizable carbon-carbon double bond and at least one monomer having a polymerizable carbon-carbon double bond and having a refractive index different from the refractive index of the above compound.

Examples of such a compound include, polymers such as polystyrene, poly(methyl methacrylate), polyethylene oxide, polyvinyl pyrrolidone, polyvinyl alcohol and nylons; low-molecular-weight compounds such as toluene, n-hexane, cyclohexane, methyl alcohol, ethyl alcohol, acetone, methyl ethyl ketone, tetrahydrofuran, ethyl acetate, dimethylformamide, dimethylacetamide and acetonitrile; and plastic additives such as organic halogen compounds, organic silicon compounds, plasticizers and stabilizers.

The above monomers which constitute the intimate mixture (c) may be the same monomers as used in the intimate mixture (a) and the polymerizable composition (b).

In the intimate mixture (c), the compound having no polymerizable carbon-carbon double bond and the monomer having the above bond are advantageously used such that based on the total weight of the above compound and the monomer, the monomer having the above bond occupies 10 to 99% by weight, preferably 50 to 95% by weight.

Preferably, in the intimate mixture (c) the refractive index of the above compound differs from the refractive index of the homopolymer of the above monomer by at least 0.01, especially preferably 0.02.

In the step (1) of the method of this invention, the photopolymerizable composition is coated on a light-pervious substrate such as a glass plate and formed into a film having a predetermined length and width. A light-pervious body having a light-impervious pattern arranged along the surface of the film is provided. As a result, an assembly comprising the film of the photopolymerizable composition and the light-pervious body with the above pattern is prepared.

Desirably, the light-pervious body having the pattern is provided in relation to the substrate. For example, it is advantageous to use a substrate on which the light-impervious pattern is provided, a substrate having a photomask portion with the light-impervious pattern, a substrate partly coated with a light-impervious object which gives a light-impervious pattern, or a substrate having a photomask with a light-impervious pattern.

The film of the photopolymerizable composition constituting the assembly has a thickness of preferably at least 25 micrometers, more preferably at least 100 micrometers, especially preferably at least 200 micrometers.

According to the method of this invention, light is irradiated to the assembly limitedly from that side where the light-pervious body is present while continuously moving the assembly in the planar direction of the film. At this time, the light to be irradiated is emitted from a first linear light source provided so that the long axis of the light source is provided at a position which crosses the moving direction of the assembly.

The first linear light source used in this invention emits ultraviolet light or an actinic light ray which contributes to the photopolymerization of the photopolymerizable composition, and is in a linear form as viewed from an irradiated position (film surface). The size of the light source viewed from the irradiated position is such that the visual angle A of the light source in the direction of its long axis is at least 8°, preferably at least 12°. The size of the light source as viewed from the irradiated position is such that its visual angle B in the direction of its short axis is at most A/4, preferably at most A/10. A rod-like ultraviolet lamp is one preferred linear irradiating light source. When a rod-like ultraviolet lamp (3 KW) having a length of about 40 cm and a diameter of about 2 cm is provided 40 cm above a film having a size of 10 cm × 10 cm maintained horizontal so that it is parallel to the film surface, its visual angle A becomes about 54°, and the visual angle B becomes about 3°. The rod-like ultraviolet lamp is a first preferred linear light source in this invention. Besides this lamp, there can be used a light source which apparently looks linear as viewed from the irradiated position, a light source obtained by aligning many point light sources continuously in an apparently linear form, and a device designed to scan light from a laser light source (irradiated from many different angles from one irradiated point) by using a rotating mirror and a convex mirror).

If the irradiating light is ultraviolet light, a mercury lamp or a metal halide lamp is preferred in view of the ease of its handling as the rod-like ultraviolet lamp.

By irradiating light at a limited angle to the assembly from that side where the light-pervious body is present, there can be obtained a light control plate which shows anisotropy in the directions of the long and short axes of the first linear light source, and only when it is rotated about the long axis direction of the light source, it scatters light of a specific angle.

In step (2), while the assembly is moved, light from a linear light source (first linear light source) positioned so that its long axis crosses the moving direction is irradiated to the moving assembly while it is partly cut by an irradiating angle limiting means (first irradiation angle limiting means) provided between the first linear light source and the assembly, namely that part of the light which falls upon upstream with respect to the moving direction of the assembly is cut. In other words, in step (2) of this invention, only that part of the light which falls upon downstream with respect to the moving direction of the assembly is irradiated onto the assembly, and therefore, the light is irradiated at a limited angle. Accordingly, in step (2), the assembly receives light irradiation from the first linear light source always at a fixed angle in the moving direction of the assembly. This makes it possible to produce a light control plate which scatters light having a fixed angle of incidence.

The advantage of irradiating light from the linear light source in this invention will become clearer if it is compared with a conventional method in which light is irradiated to a stationary assembly. If light from a linear light source is irradiated from the stationary assembly, the angle of irradiation from the light source evidently varies with the position of a site on the assembly in the direction crossing the long axis of the linear light source. As the site of irradiation is apart from a position immediately below the light source and the incident angle of irradiation is changed as viewed from the light source, the angle of light irradiation to the assembly becomes gradually gentle, and therefore, a light control plate is obtained in which the angle of incident light scattered varies in a direction crossing the long axis of the linear light source. For example, by the above method of irradiating light to the stationary assembly, even a light control plate produced so as to scatter light having an angle of incidence in a perpendicular direction, light having an angle of incidence in a perpendicular direction is pervious without scattering in a portion in which the damage of the incident angle is 20° or more.

The first irradiation angle limiting means, as will be clear from the specific description to be given below with reference to the accompanying drawings, is provided so as to shut off the moving assembly from light irradiation in a moving direction. The shape of the tip portion of the first light irradiation angle limiting means, which limits the light irradiation angle to the assembly, is preferably a straight line. The straight line tip portion may be perpendicular or tilted to the moving direction of the assembly.

Furthermore, the first linear light source is desirably provided such that the length of its long axis is equal to, or larger than, its length which crosses the moving direction of the assembly at right angle. If the length of the first linear light source becomes larger, light irradiation from this light source is more liable to go rearwardly of the light-impervious pattern. Consequently, that portion of the film which is to be covered with the light-impervious pattern will be polymerized and cured and give a non-transparent visual field around a fixed angle. To avoid this inconvenience, the light irradiation in step (2) of the invention is preferably carried out through a plurality of light baffling plates provided in a space between the first linear light source and the first irradiation angle limiting means. The light baffling plates are arranged such that the surfaces of the plates face each other, and are aligned substantially perpendicularly to the surface of the assembly at nearly equal intervals in the long axis direction of the first linear light source.

If the light emitted from a certain position in the long axis direction of the liner light source reaches that part of the film which is relatively remote from the above position, it will go rearwardly of the light-impervious pattern. But if the light irradiation is carried out through the light baffling plates, the light is cut off by the baffling plates and cannot reach that film part. In other words, by carrying out light irradiation through the light baffling plates, light emitted from a certain position in the long axis direction of the linear light source reaches only that film portion which is immediately below that position or in its neighborhood, and therefore, does not go rearwardly of the light-impervious pattern.

According to this invention, that part of the film which remains uncured in step (2) because it was covered with the light-impervious pattern is polymerized by light irradiation or heating in step (3).

The light irradiation in step (3) may be carried out by using the linear light source, a point light source, a scattered light source or a parallel light source.

When the linear light source is used for light irradiation, irradiation is advantageously performed from a second linear light source arranged on the opposite side to the first linear light source with the assembly interposed between the first and the second linear light sources so that the long axis of the second linear light source is positioned in a direction crossing the moving direction of the assembly. Preferably, in this case, the light irradiated is partly cut by a second irradiation angle limiting means disposed between the assembly and the second linear light source and positioned more downstream of the moving direction of the assembly than the first irradiation angle limiting means, and light is irradiated at a limited angle with respect to the assembly. By so doing, that film part which did not underwent photocuring in step (2) can be formed into a photocured structure which scatters only light having a fixed angle of incidence. Of course, the irradiation (limited) angle from the second linear light source in step (3) should be made different from the irradiation (limited) angle from the first linear light in step (2). If the angles are made identical, the light-impervious pattern will disappear in step (3).

The description of the first linear light source and the first irradiation angle limiting means will be directly applicable to a description of the second linear light source and the second irradiation angle limiting means.

The light irradiation in step (3) can also be performed by a point light source, a parallel light source or a scattering light source provided on the opposite side of the first linear light source with the assembly between them. According to the point light source or the parallel light source, the photocured portion becomes a nontransparent portion which scatters incident light of any angle. By the diffusion light source, the photocured portion becomes a transparent portion which is pervious to incident light of any angle.

The present invention also provides a method of producing a light control plate, which comprises a first step of preparing the polymerizable composition, a second step of performing the first light irradiation by a point light source, a diffused light source or a parallel light source, and a third step of performing light irradiation by using a linear light source.

This second method of the invention comprises (1) preparing an assembly comprising a film of a photopolymerizable composition and a light-pervious body having a light-impervious pattern arranged along the surface of the film, said polymerizable composition being selected from (a) an intimate mixture of at least two monomers having polymerizable carbon-carbon double bonds and being capable of forming polymers having different refractive indices, (b) at least one monomer having a plurality of polymerizable carbon-carbon double bonds in the molecule, and (c) an intimate mixture of a compound free from a polymerizable carbon-carbon double bond and at least one monomer having a polymerizable carbon-carbon double bond and capable of forming a polymer having a different refractive index from that of said compound, (2) while the assembly is moved continuously in the planar direction of the film, irradiating light at a limited angle to the assembly from that side where the light-pervious body is present, thereby polymerized at least a part of the photopolymerizable composition of the film, said light being emitted from a first light source selected from a point light source, a parallel light source and a diffused light source provided on that side of the light-pervious body in which the light-pervious body is present, preferably partly cut by a first light irradiation limiting means, and irradiated to the assembly; and then (3) polymerizing the photopolymerizable composition in that part of the film-like molded article which is covered with the light-impervious pattern of the light-pervious body; wherein the light irradiation is carried out from a second linear light source provided so that its long axis is positioned in a direction crossing the moving direction of the assembly, and the light irradiation is carried out on the assembly at a limited angle as a result of partly being cut by a second irradiation angle limiting means positioned between the assembly and the second linear light source more downstream of the moving direction of the assembly than the first irradiating angle limiting means.

The step (1) is quite the same as the step (1) of the first method of this invention described above.

In the step (2), the polymerizable composition of that film portion which is not covered with the light-impervious pattern is irradiated first from a first light source which is a point light source, a parallel light source and a diffused light source to change it to a non-transparent portion or a transparent cured portion.

In the step (3), that film portion which is not covered with the light-impervious pattern and is not cured in step (2) is light-irradiated and cured by the linear light source (the second linear light source) in the same way as step (2) of the first method.

By the above method, a light control plate can be produced which scatters light having different incident angles at different places.

This light control plate having selective light scattering function will be described in detail with reference to the drawings.

A linear light source is placed at a position tilted about 45° measured from a perpendicular plane set up from the center of the film surface, for example, about 40 cm above a horizontally placed unpolymerized film, and is disposed so that the longitudinal direction of the light source is parallel to the perpendicular plane and horizontal. When light is irradiated from this light source to induce curing reaction of the film, anisotropy is produced in the cured film. When a sectional surface of the cured film is taken as shown in FIG. 9, a layer 14 of a microstructure is formed in the inside of the cured film 13 shown in FIG. 9. The thickness d2 of this layer is about 25 to 5,000 micrometers. The depth d1 from the surface to the layer is 0 to 100 micrometers. The thickness d1 varies depending upon the atmosphere in which the curing reaction of the film takes place. The thickness d3 of the layer is usually 25 to 5,000 micrometers.

As shown in FIG. 10 (a top plan view) and FIG. 9 (sectional view), the microstructural layer 14 is composed of a number of elongated microstructural materials 16 and 17 which stretch nearly parallel to the light source 18.

As shown in FIG. 11-a which is a sectional view taken on line A—A' of FIG. 10, each of the microstructural materials 16 and 17 is tilted at an angle Z' which is smaller than the irradiation angle Z from the irradiation source shown in FIG. 11-b. This angle Z' is nearly equal to the diffraction angle at which the irradiated light refracts and proceeds within the film. The pitch d5 between each microstructural materials 16 and 17 is 0.1 to 20 micrometers.

The selective light scattering property is such that in FIG. 12, the light which falls at an incidence angle Y1 equal to the irradiation angle Z from the irradiating source and the light which falls at an incidence angle of Y2 equal to the irradiation angle on the opposite side of the film ar scatiered most strongly. In other words, when the other side is viewed through a film at that angle, the films looks most hazy and the visual field is hindered. The incident light which is parallel to the sheet surface in FIG. 12, and contains light having an incidence angle Y1 or Y2 and which falls upon the film through a plane perpendicular to the sheet surface (incident light having an incidence angle equal to Y1 or Y2 when it is measured by projection onto the sheet surface) is most strongly scattered. Haze percentages to light of various incidence angles show a graph of a chevron shape in which the haze percentage is the largest near the incidence angle Z. If the size of the irradiating light source decreases and the visual angle A of the long axis is less than 5°, the polymerized film no longer shows anisotropy, and scatters light at any incidence angles. Thus, the film obtained by polymerization by using a point light source or by using substantially parallel light shows light scattering in any direction.

If, on the other hand, the size of the irradiating light source becomes gradually larger, the height of the chevron shape in the graph of haze percentage becomes lower. When the size of the irradiating light source is in terms of a visual angle B of more than 100°, the film no longer shows anisotropy. The irradiated polymerized film is transparent when viewed in any direction, and does not show selective light scattering.

Examples of such a light source are a planar light source disposed relatively near a film to be polymerized and a diffusion light source. When the film is polymerized by heating, too, the polymerized film becomes transparent.

It is not clear why a film polymerized by using the linear light source shows selective light scattering. In FIG. 10, microstructural materials 16 and 17 are of layer structures having different refractive indices (such differences in refractive index are closely related to the difference in refractive indices of homopolymers of photopolymerizable monomers used as starting materials). Presumably, the reason may be that light which falls upon at an incidence angle near the inclination angle Z' of the microstructural material is reflected and scattered at a boundary between areas having different refractive indices. The angle selectivity is determined depending upon the distance between layer structures by the angle selectivity. If the layer distance is smaller, the angle width for scattering becomes larger. The haze percentage which expresses the degree of scattering is affected by the differences of refractive index between the microstructures (microstructural materials 16 and 17). Specifically, when the difference in refractive index and the disturbance of the layer structure are greater, the haze percentage becomes higher. If the disturbance of the layer structure remains the same the distance over which light advances becomes longer as the thickness of the film is larger. Hence, the degree of scattering is amplified, and the haze percentage becomes higher.

If the irradiating light source is a diffusion light source, such microstructure is not formed, and the film is transparent and does not show selective light scattering. If the irradiating light source is a point light source, a microstructure is formed in the film. But it is not regular as is the case with the linear irradiation light source and is randomly arranged. Accordingly, any incident light is reflected with the microstructure, and the resulting film scatters light in any direction.

The following Examples illustrate the invention more specifically. The invention, however, should not be limited to these examples.

EXAMPLE 1

A polymerizable composition was prepared composed of 100 parts of polyether urethane acrylate (refractive index 1.481) composed of polypropylene glycol having an average molecular weght of 2,000. hydroxyethyl acrylate and isophorone diisocyanate, 100 parts of tribromophenoxy ethyl acryate (refractive index 1.567) and 6 parts of hydroxyisobutyl phenone).

Figure 2:
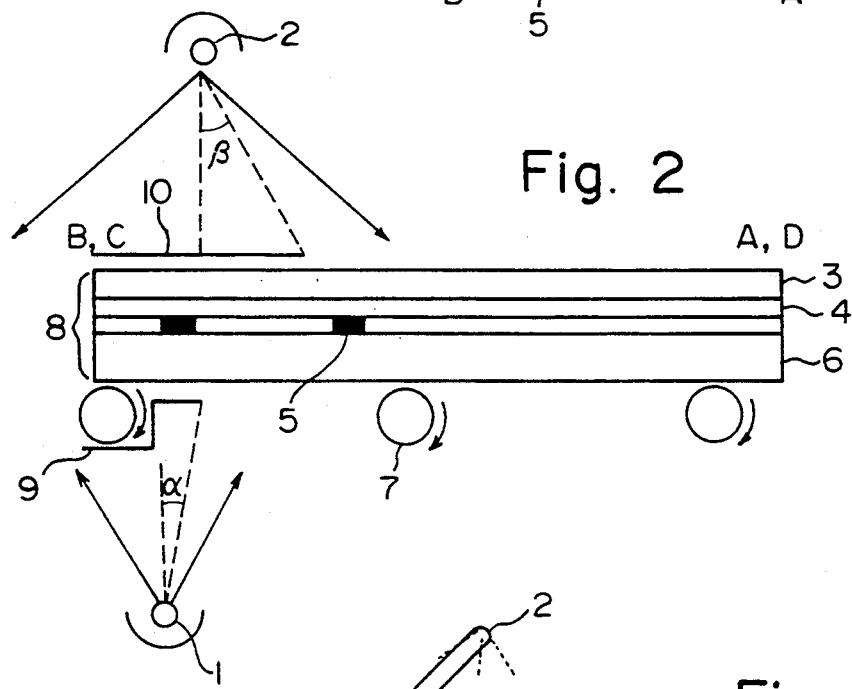
FIG. 2 is a rough view for illustrating the present invention together with an apparatus for practising the method of this invention.
Figure 3:
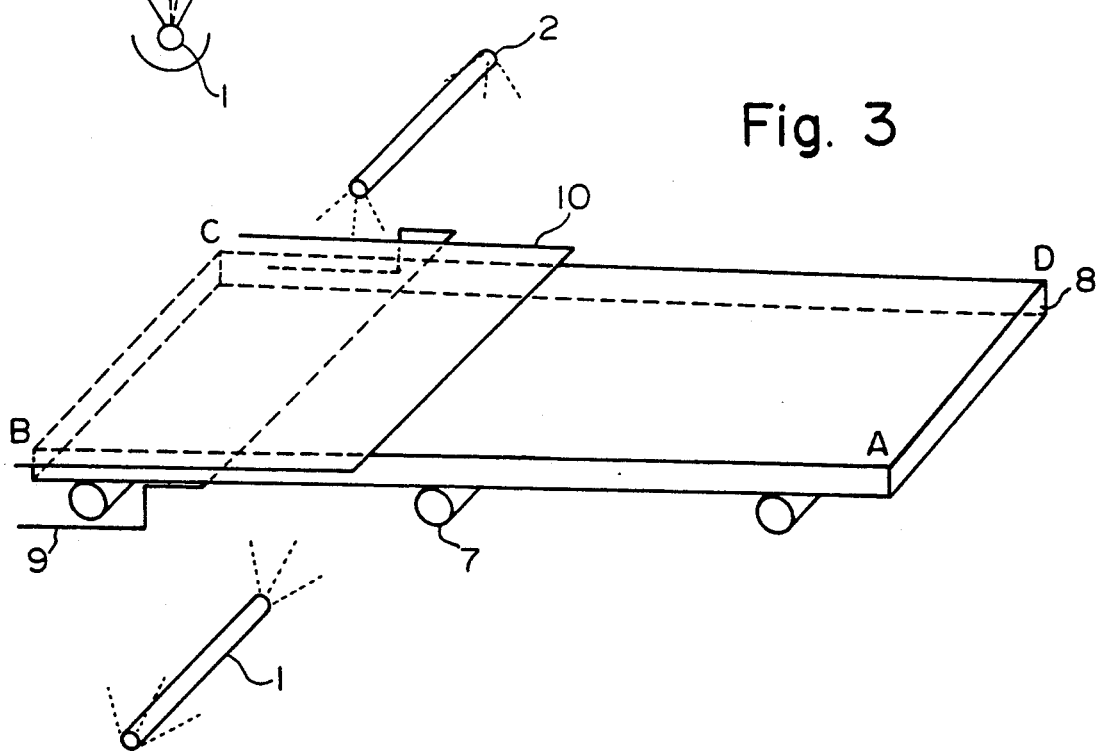
FIG. 3 is a rough perspective view of the apparatus shown in FIG. 2.
Figure 5:
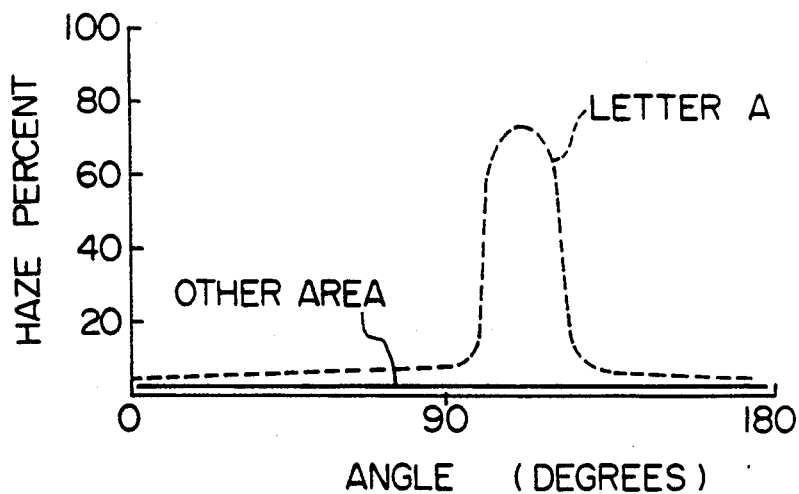

As shown in FIG. 1, on the under surface of a transparent glass sheet 4 having a thickness of 2 mm, a length (AB) of 70 cm and a width (BC) of 30 cm, a FIGURE 5 of the letter "A" having a thickness of about 0.05 mm was drawn by using a black paint which was light-impervious. On the upper surface of the glass sheet 4, the above polymerizable composition was poured to form a film 3 having a thickness of 300 micrometers. The film 3, the glass sheet 4 and the FIG. 5 were then held on a transparent glass sheet 6 having a thickness of 3 mm. As shown in FIGS. 2 and 3, the assembly 8 prepared as above was placed on rotating rolls 7 provided at intervals 30 cm. The rolls 7 were rotated at a fixed speed, and the assembly 8 was placed horizontally so that its advancing direction was parallel to the longitudinal direction (AB) of the assembly 8. The assembly 8 was moved (in the right direction in the drawings) at a speed of 400 mm/min.

A first rod-like ultraviolet lamp 1 (80 W/cm, 2 KW, lamp diameter 2 cm, lamp length 25 cm) was placed at a position 400 mm below the bottom surface of the assembly so that its longitudinal direction was horizontal and parallel to the shafts of the rolls 7, namely at right angles to the longitudinal direction (AB) of the assembly 8. A first irradiation angle limiting means 9 was provided immediately below the bottom surface of the assembly. The tip portion of the irradiation angle limiting means 9 was positioned parallel to the lateral direction (BC) of the assembly at a site tilted at an angle of 10 degrees ($\alpha$) from immediately above the ultraviolet lamp 1 in the drawing in the right direction. A second rod-like ultraviolet lamp 2 (having the same specification as the lamp 1) was provided at a height 400 mm above the assembly horizontally so that it was parallel to the lateral direction (AB) of the assembly 8. A second irradiation limiting means 10 was disposed immediately above the upper surface of the assembly. The tip portion of the second irradiation angle limiting means 10 was positioned parallel to the shaft of the roll at an angle inclined by 20 degrees ($\beta$) rightward from immediately below the ultraviolet lamp in the drawings and at a position about 20 cm downstream from the tip portion of the first irradiation angle limiting means. While the assembly 8 was moved by the rotation of the rolls 7, it first received light from the rod-like ultraviolet lamp 1, and only that part of the polymerizable composition 3 which was not covered with the letter "A" of the black paint and permitted passing of light was polymerized and cured. Further, the assembly 8 was moved and the film portion which had been covered with the letter "A" was irradiated from the ultraviolet lamp 2 and polymerized and cured. By peeling the cured film from the glass sheet 4, a film-like light control plate was obtained.

Figure 4:
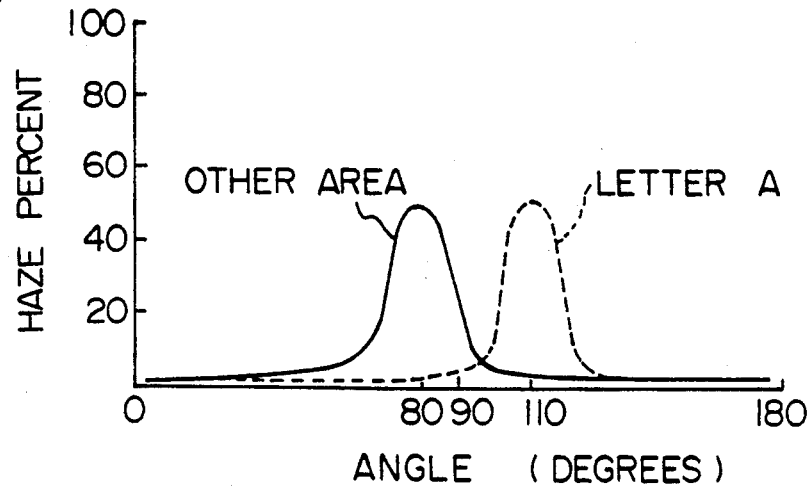
FIGS. 4, 5 and 6 show characteristics of light control plates produced by the method of this invention.

By measuring the total light transmittance of this light control plate and the scattered light transmittance with respect to the film portion covered with the letter "A" and the other film portion, and the haze percentage was determined in accordance with JIS K-6714. The light control plate was tilted about a shaft parallel to the side BC, and light was caused to fall upon the light control plate in a direction at right angles to the side BC to vary the angle between the incident light and the light control plate. The above haze percentages were calculated. The variations of the haze percentage with respect to the incidence angle are shown in FIG. 4. In FIG. 4, the dotted line shows the haze percentage of a portion corresponding to the letter "A", the solid line, the haze percentage of a portion corresponding to other area. The absolute value of the haze percentage of the incident light having an incidence angle of 110 degrees in the portion corresponding to the letter "A" of the light control plate was about 50. The absolute value of haze percentage of the incident light having an incidence angle of 80 degrees is about 50%. When the light control plate was observed in the front, the entire surface of the light control plate was slightly hazy, and the letter "A" was scarcely distinguished. But when the light control plate was tilted to the right by an angle of about 10 degrees, a transparent letter "A" was seen in a hazy surrounding. If it was tilted to the left by an angle of about 20 degrees a hazy letter "A" was seen in a transparent surrounding. When the light control plate was tilted at an angle of at least about 30 degrees to left and right, the entire surface of the light control plate became transparent and the letter could not be seen. Thus, the resulting light control plate simultaneously have areas having different absolute haze percentages and angle dependencies.

EXAMPLE 2

Example 1 was repeated except that instead of the glass plate having a thickness of 3 mm in FIG. 1, a frosted glass sheet 6 having a thickness of 3 mm was used, and a polymerizable composition composed of 100 parts of polyether urethane acrylate comprising polytetramethylene ether glycol, toluene diisocyanate and hydroxyethyl acrylate. 100 parts of tribromophenyl methacrylate and 6 parts of benzyl methyl ketal was applied. The incidence angle dependence of the resulting light control plate was obtained as shown in FIG. 5.

EXAMPLE 3

Figure 6:
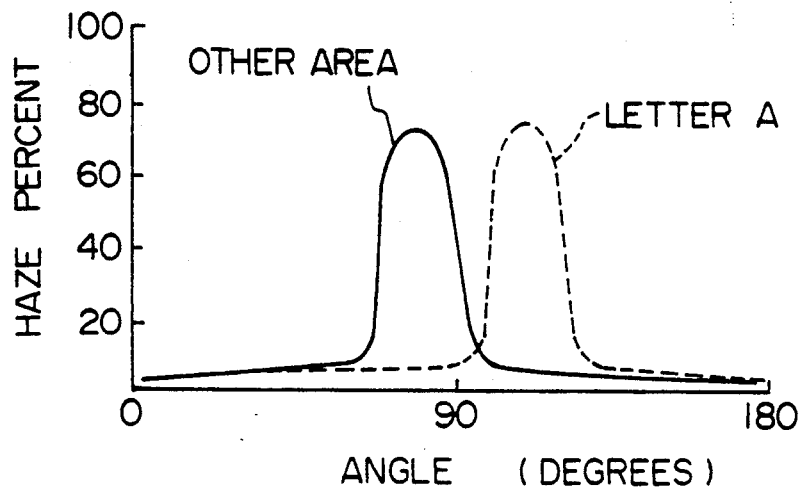

Example 1 was repeated except that a film of polyethylene terephthalate having a thickness of 175 micrometers was used instead of the glass plate having a thickness of 0.3 mm shown in FIG. 1, and a polymerizable composition composed of 100 parts of polyether urethane acrylate comprising polytetramethylene ether glycol, toluene diisocyanate and hydroxyethyl acrylate, 100 parts of tribromophenyl methacrylate and 6 parts of benzyl methyl ketal was applied. The incidence angle dependency of the haze percentage of the resulting light control plate is shown in FIG. 6.

EXAMPLE 4

Example 1 was repeated except that a polymerizable composition composed of 30 parts of poly(methyl methacrylate) (refractive index 1.490), 70 parts of phenoxy ethyl acrylate (the refractive index of the resulting polymer was 1.557), 10 parts of triethylene glycol di-2-ethylbutyrate and 3 parts of 2-hydroxy -2-methyl propiophenone was used.

Figure 13:
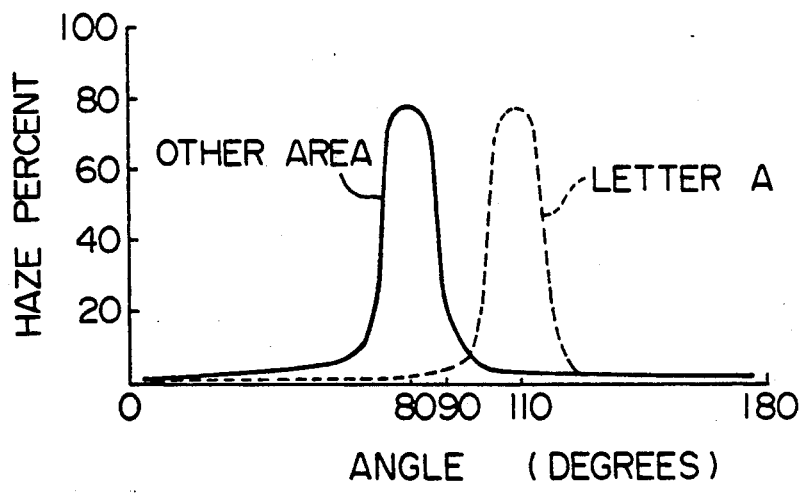
FIG. 13 is the incident angle dependency of the haze percentage of the resulting light control pate of the present invention.

The incidence angle dependency of the haze percentage of the resulting light control plate is shown in FIG. 13.

EXAMPLE 5

A polymerizable composition was prepared by mixing 100 parts of polyether urethane acrylate (refractive index 1.490) obtained by the reaction of polytetramethylene ether glycol having an average molecular weight of 2,000 with 2-hydroxyethyl acrylate, 100 parts of tribromophenoxyethyl acrylate and 6 parts of benzyl methyl ketal.

Figure 7:
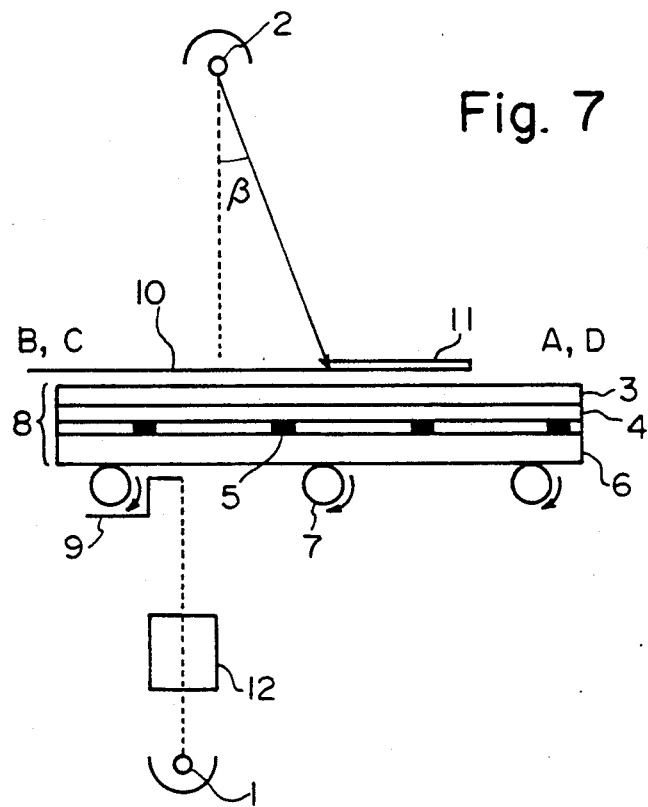
FIG. 7 is a rough view for illustrating the present invention including an apparatus including light baffling plates for the practice of the method of this invention.
Figure 8:
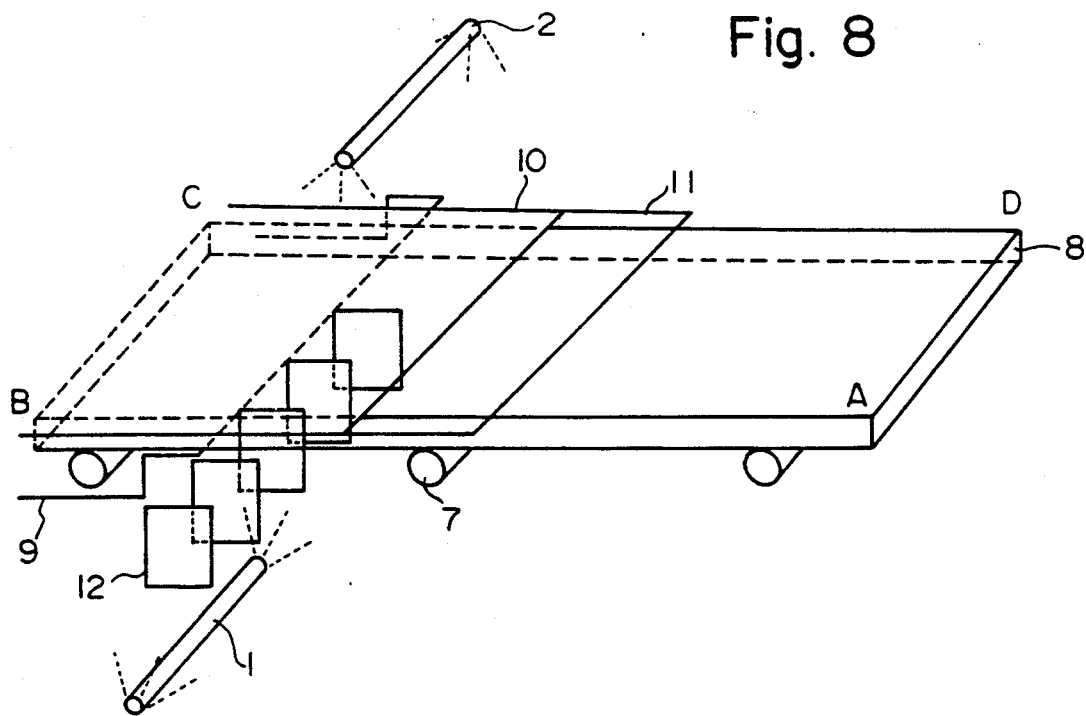
FIG. 8 is a rough perspective view of the apparatus shown in FIG. 7.

The resulting composition was poured onto the upper surface of a glass sheet 4 having a thickness of 2 mm, a length (AB) of 70 cm and a width (BC) of 50 cm. A lattice pattern with a plurality of transparent longitudinal lines (each having a width of 2 mm arranged at an interval of 2 mm) and a plurality of transparent lateral lines (each having a width of 5 mm arranged at an interval of 15 mm) was formed by a light-impervious black paint on the under surface of a transparent glass 4. The filmed glass sheet 4 and the lattice pattern were further held on a transparent glass having a thickness of 3 mm. As shown in FIGS. 7 and 8, the assembly prepared as above was placed on rotating rolls 7 arranged at intervals of 30 cm. The assembly 8 was placed horizontally so that the advancing direction of the assembly 8 would be parallel to the longitudinal direction (AB) of the assembly. The assembly 8 was moved at a speed of 400 mm/min. (to the right direction in the drawings). At a position 700 mm below the bottom of the assembly was provided a first rod-like ultraviolet lamp 1 (80 W/cm, 5.6 KW, lamp diameter 2 cm and the lamp length 70 cm) with its longitudinal direction being horizontal and parallel to the shafts of the rotating rolls 7, or in other words, at right angles to the longitudinal direction (AB) of the assembly 8. Furthermore, 13 light baffling plates 12 made of aluminum with a thickness of 3 mm of 20 cm×20 cm which were anodized at a surface area, perpendicularly to the long axis direction of the lamp were arranged at intervals of 5 cm at positions 15 cm above the lamp 1. A first irradiation angle limiting means 9 was disposed immediately below the bottom surface of the assembly. The tip portion of the first irradiation angle limiting means 9 was positioned parallel to the lateral direction (BC) of the assembly at a position perpendicular from immediately below the ultraviolet lamp 1 in the drawings. A second rod-like ultraviolet lamp 2 (having the same specifications as the lamp 1) was provided at a position 400 mm above the assembly so that it was parallel to the lateral direction (BC) of the assembly 8. The tip portion of the second irradiation angle limiting means 10 was positioned at an angle tilted by 20 degrees ($\beta$) to the right from immediately below the ultraviolet lamp 2 and at a position about 20 cm downstream from the tip portion of the first irradiation angle limiting means 9 in parallel to roll shafts. A frosted glass 11 having a thickness of 2 mm was provided so as to cover the entire width of a length of 20 cm from the tip of the second irradiation angle limiting means 10 in the downstream direction. While the assembly 8 was moved by the rotation of the rolls 7, the assembly 8 first received light from the rod-like ultraviolet lamp 1, and the polymerizable composition 3 was polymerized and cured only at that portion which was not covered with the black paint and permitted permeation of light. The light from the ultraviolet lamp 2 passed through the frosted glass and became scattered light. As the assembly 8 was further moved, this scattered light radiated the film portion which was covered with the black paint to polymerize and cure that film portion. By peeling the cured film from the glass sheet 4, a film-like light control plate was obtained.

When this light control plate was viewed from the front in the direction in which the first linear lamp was provided, the portion having the lattice pattern looked non-transparent, and the other portion looked transparent at any angles. When the light control plate was rotated at an angle of more than 25 degrees to the left and right of the axial direction of the side BC, the portion having the lattice pattern also looked transparent, and the contour of the lattice pattern completely got out of sight.

The light control plate was viewed from the front in the direction in which the lamp was provided, and the widths of the longitudinal and lateral lines were examined. As a result, it was found that the longitudinal lines had a width of 2.1 mm, and the lateral lines had a width of 5 mm.

A light control plate was prepared in the same way as above except that the light baffling plates were removed.

The resulting light conrol plate was viewed from the front in the direcion in which the lamp was provided. It was found that the longitudinal lines of the non-transparent lattice pattern had a width of 2.7 mm, and the lateral lines had a width of 5 mm.

We claim:

1. A method of producing a light control plate which induces scattering of light at different angles of incidence for different places, which comprises:
    (1) preparing an assembly comprising a film of a photopolymerizable composition and a light-pervious body having a light-impervious pattern arranged along the surface of the film, said polymerizable composition being selected from the group consisting of (a) an intimate mixture of at least two monomers having polymerizable carbon-carbon double bonds and being capable of forming polymers having different refractive indices, (b) at least one monomer having a plurality of polymerizable carbon-carbon double bonds in the molecule, and (c) an intimate mixture of a compound free from a polymerizable carbon-carbon double bond and at least one monomer having a polymerizable carbon-carbon double bond and capable of forming a polymer having a different refractive index from that of said compound;

(2) irradiating light to the assembly from that side where the light-pervious body exists while moving the assembly continuously in the planar direction of the film, thereby to polymerize at least part of the photopolymerizable film, the light being irradiated from a fixed first linear light source whose long axis is positioned in a direction crossing the moving direction of the assembly at a predetermined angle ($\alpha$) to the surface which is at right angles to the surface of the film and which passes the long axis of the linear light; and thereafter (3) polymerizing the photopolymerizable composition of that portion of the film which is covered with the light-impervious pattern of the light-pervious body by light irradiation or heating.

2. The method of claim 1 in which the light in step (2) is partly cut by a first irradiation angle limiting means positioned between the assembly and the first linear light source and irradiated to the assembly at a limited angle.

3. The method of claim 1 in which the light irradiation in step (2) is carried out through a plurality of light baffling plates disposed in the space between the first linear light source and the first irradiation angle limiting means, and the baffling plates are arranged substantially vertically to the plane of the assembly with the individual surfaces facing each other and at equal intervals in the longitudinal axis direction of the first linear light source.

4. The method of claim 1 in which the polymerization in step (3) is carried out by light irradiation from a second linear light source disposed opposite to the first linear light source with the assembly between the first and the second linear light sources, said second linear light source is provided so that its long axis is positioned ed in a direction crossing the moving direction of the assembly, and the light irradiated from the second linear light source is partly cut by a second irradiation angle limiting means positioned between the assembly and the second linear light source on the more downstream side in the moving direction of the assembly than the first irradiation angle limiting means, and is irradiated limitedly to the assembly.

5. The method of claim 1 wherein the polymerization in step (3) is carried out by light irradiation, and the light irradiation is carried out by means of a second light source selected from a point light source, a diffused light source and a parallel light source which is disposed opposite to the first linear light source with the assembly between the first and second linear light sources.

6. A method of producing a light control plate which scatters light having different angles of incidence for different places, which comprises:

(1) preparing an assembly comprising a film of a photopolymerizable composition and a light-pervious body having a light-impervious pattern arranged along the surface of the film, said polymerizable composition being selected from the group consisting of (a) an intimate mixture of at least two monomers having polymerizable carbon-carbon double bonds and being capable of forming polymers having different refractive indices, (b) at least one monomer having a plurality of polymerizable carbon-carbon double bonds in the molecule, and (c) an intimate mixture of a compound free from a polymerizable carbon-carbon double bond and at least one monomer having a polymerizable carbon-carbon double bond and capable of forming a polymer having refractive index different from that of said compound, (2) while the assembly is moved continuously in the planar direction of the film irradiating light to the assembly from that side where the light-pervious body is present, thereby to polymerize at least a part of the photo-polymerizable composition of the film, said light being emitted from a first light source selected from a point light source, a diffused light source and a parallel light source provided on that side of the assembly in which the light-pervious body is present, preferably partly cut by a first light irradiation limiting means, and irradiated to the assembly; and then (3) polymerizing the photopolymerizable composition in that part of the film which is covered with the light-pervious pattern of the light-pervious body; wherein the light irradiation is carried out from a fixed second linear light source provided so that its long axis is positioned in a direction crossing the moving direction of the assembly, and the light irradiation is carried out on the assembly at a predetermined angle ($\beta$) to the surface which is at right angles to the surface of the film and which passes the long axis of a fixed second linear light source as a result of partly being cut by a second light irradiation limiting means positioned between the assembly and the second linear light source, the tip of the downstream side in the moving direction of the assembly of the second light irradiation limiting means being positioned further downstream than the tip of the downstream side of the first light irradiating limiting means.

* * * * *